United States Patent [19]

Ma

[11] Patent Number: 5,442,191

[45] Date of Patent: Aug. 15, 1995

[54] ISOTOPICALLY ENRICHED SEMICONDUCTOR DEVICES

[75] Inventor: Tso-Ping Ma, Branford, Conn.

[73] Assignee: Yale University, New Haven, Conn.

[21] Appl. No.: 270,394

[22] Filed: Jul. 5, 1994

Related U.S. Application Data

[63] Continuation of Ser. No. 932,763, Aug. 20, 1992, abandoned, which is a continuation-in-part of Ser. No. 615,425, Nov. 16, 1990, Pat. No. 5,144,409, which is a continuation-in-part of Ser. No. 577,526, Sep. 5, 1990, abandoned.

[51] Int. Cl.[6] .......................................... H01L 27/24
[52] U.S. Cl. ........................................ 257/1; 257/289
[58] Field of Search ......................... 257/21, 1, 2, 289

[56] References Cited

U.S. PATENT DOCUMENTS

| | | |
|---|---|---|
| 4,628,341 | 12/1986 | Thomas . |
| 4,721,684 | 1/1988 | Musumeci . |
| 4,884,119 | 11/1989 | Miller ..................................... 257/21 |
| 5,094,915 | 3/1992 | Subramaniam ..................... 428/408 |
| 5,146,314 | 9/1992 | Pankove .............................. 257/712 |

FOREIGN PATENT DOCUMENTS

| | | |
|---|---|---|
| 55-93256 | 7/1980 | Japan . |
| 61-274322 | 12/1986 | Japan . |
| 63-115385 | 5/1988 | Japan . |
| 63-269573 | 11/1988 | Japan . |

OTHER PUBLICATIONS

T. H. Geballe et al., "Isotopic and Other Types of Thermal Resistance in Germanium", *Physical Review*, vol. 110, 1958, pp. 773–775.

G. A. Slack, "Effect of Isotopes on Low-Temperature Thermal Conductivity", *Physical Review*, vol. 105, No. 3, 1957, pp. 829–831.

M. W. Browne, "G.E. Sees Breakthroughs From New Diamond", *The New York Times*, Jul. 11, 1990, p. D6.

T. R. Anthony et al., "Thermal Diffusivity of Isotopically Enriched $^{12}$C Diamond", *Physical Review B*, vol. 42, No. 2, Jul. 1990, pp. 1104–1111.

*Primary Examiner*—J. Carroll
*Attorney, Agent, or Firm*—Fish & Richardson

[57] ABSTRACT

A semiconductor structure including a single-crystal region composed of an isotopically enriched material, wherein the isotopically enriched material is selected from a subset consisting of all semiconductor materials except elemental silicon; and a semiconductor device formed by using said isotopically enriched semiconductor region.

17 Claims, 2 Drawing Sheets

ISOTOPICALLY ENRICHED SEMICONDUCTOR DEVICES

This is a continuation of application Ser. No. 07/932,763, filed Aug. 20, 1992, now abandoned, which is a continuation-in-part of application Ser. No. 07/615,425, filed Nov. 16, 1990, U.S. Pat. No. 5,144,409, which is, in turn, a continuation-in-part of application Ser. No. 07/577,526, filed Sep. 5, 1990 abandoned.

BACKGROUND OF THE INVENTION

The invention relates to semiconductor devices fabricated from semiconductor materials.

Silicon, an abundantly available element in nature, has become one of the most commonly used materials for fabricating electrical and electro-optical devices. In its naturally occurring form, silicon is primarily composed of three isotopes of silicon, namely, 92.2% $^{28}Si$ 4.7% $^{29}Si$, and 3.1% $^{30}Si$ which is also roughly the composition of the silicon crystals used by the silicon device industry. Due to its many desirable properties, in comparison to other semiconductors, not the least of which is the ability to easily grow $SiO_2$ insulation layers on it, silicon has provided the foundation upon which a semiconductor industry has been built.

Devices fabricated on single-crystal silicon have performance characteristics that are governed by the electrical and physical properties of the silicon itself. Some of the important properties of the single-crystal silicon which affect device characteristics are carrier mobilities, energy band gap, effective mass of the carriers, and thermal conductivity. Carrier mobilities, for example, govern signal transit times and thus place a limit on device speed. Thermal conductivity, on the other hand, governs power dissipation which, in turn, places an upper limit on the packing densities achievable for devices on a chip or the amount of power that can safely be generated in the circuit without significantly degrading circuit performance.

As engineers push the performance of the silicon-based devices, the electrical and physical properties of the silicon often place serious limits on what is ultimately achievable from such devices. For example, as signals and data communications advanced into the higher reaches of the frequency domain, the speed limitations inherent in silicon-based devices caused engineers to shift from silicon to other semiconductor materials, such as GaAs, which exhibit substantially higher carrier mobilities and thus are capable of performance at higher frequencies. The electron mobility in GaAs is over five times greater than that the carrier mobilities typically associated with silicon. This shift to GaAs was felt necessary in spite of the greater technological difficulties associated with fabricating devices from GaAs as compared to silicon. For example, it is appreciably more difficult to grow single-crystal GaAs and to form useful insulating layers on the GaAs.

SUMMARY OF THE INVENTION

In general, in one aspect, the invention is a semiconductor structure including a single-crystal region composed of an isotopically enriched material, wherein the isotopically enriched material is selected from a subset consisting of all semiconductor materials except elemental silicon; and a semiconductor device formed by using the isotopically enriched semiconductor region.

Preferred embodiments include the following features. The semiconductor structure also includes a substrate and the isotopically enriched semiconductor region is layer formed on one surface of said substrate. The isotopically enriched material exhibits higher carrier mobilities and/or thermal conductivity in comparison to naturally occurring forms of the material and the semiconductor device exhibits improved device performance due to the higher carrier mobilities and/or thermal conductivity. The subset of all semiconductor materials except elemental silicon includes group IV—IV compounds, group III-V compounds, group II-VI compounds, and group IV elements other than elemental silicon. The group IV—IV compounds includes SiC; the group III-V compounds includes GaAs, InSb, InAs, InP, and GaInPAs; and the groups II-VI compounds include CdS, CdTe, HgTe, and HgCdTe.

Also in preferred embodiments, the semiconductor device is an electronic device, an electro-optical device, or an opto-electronic device. In addition, the semiconductor structure includes an integrated circuit fabricated in the isotopically enriched semiconductor region. In the semiconductor structure, the isotopically enriched semiconductor region primarily serves to provide heat dissipation for said device.

Isotopically enriched single-crystal semiconductor material will exhibit significantly higher carrier mobilities and thermal conductivity than single-crystal material made from the sources of naturally occurring semiconductor. Higher carrier mobilities mean that devices fabricated from the isotopically enriched material will exhibit faster device speeds and higher frequency performance than was previously possible using conventional compositions of the semiconductor material. Higher carrier mobilities also imply lower resistivity and thus lower heat generation within the material. In addition, higher thermal conductivity means that the isotopically enriched semiconductor devices will exhibit better heat dissipation, thereby making it possible to increase device packing densities within integrated circuit chips and to increase power output per unit area of power devices. Furthermore, the invention has applicability in device structures, such as, semiconductor laser arrays, which utilize semiconductor substrates or semiconductor layers primarily for heat dissipation. Using the invention in those cases will improve the thermal performance of the devices and also make higher packing densities possible.

Other advantages and features will become apparent from the following description of the preferred embodiment and from the claims.

DESCRIPTION OF THE PREFERRED EMBODIMENT

STRUCTURE

Figure 1:
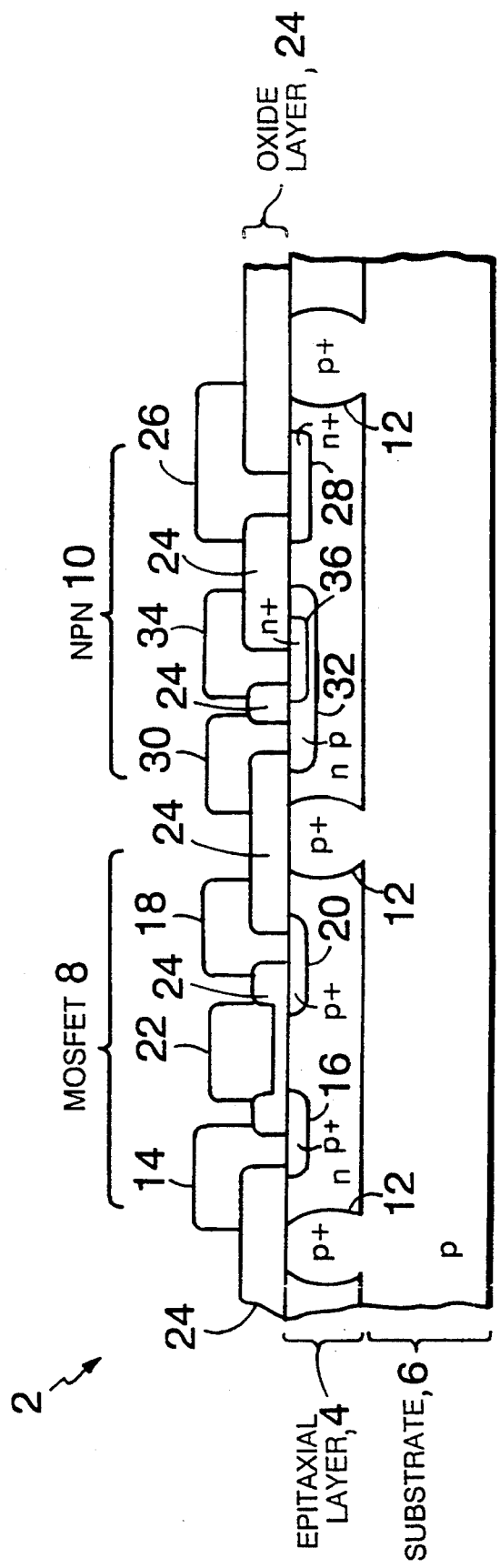
FIG. 1 is a cross-section of a representational portion of wafer on Which an integrated circuit is fabricated.

Referring to FIG. 1, integrated circuit 2 is fabricated in an n-type epitaxial layer 4 that is formed on one side of a p-type silicon substrate 6. N-type epitaxial layer 4 is a single-crystal silicon layer composed of isotopically enriched silicon in which the percentage of $^{28}$Si is greater than the percentage of that isotope typically found in naturally occurring sources of silicon. More specifically, the percentage of $^{28}$Si is greater than at least 94% and more preferably is greater than 98%, with the aggregate of other isotopes of silicon, namely, $^{29}$Si and $^{30}$Si being reduced accordingly In addition, in this application, a material is defined to be single-crystal if it has single-crystal structure over a distance that is larger than the dimensions of the devices that are or will be fabricated using that silicon material.

The illustrated portion of integrated circuit 2 includes a metal-oxide-semiconductor field effect transistor (MOSFET) 8 and an NPN bipolar transistor 10, each of which is isolated from the other and from other devices on the chip by p+-type regions 12 that are diffused through epitaxial layer 4 into substrate 6. MOSFET 8 is a conventionally designed device including a drain metallization 14 in contact with a p+-type drain region 16, a source metallization 18 in contact with a p+-type source region 20 and a gate metallization 22 isolated from electrical contact with epitaxial layer 4 by a SiO$_2$ layer 24.

NPN transistor 10 is also of conventional design and includes a collector metallization 26 in contact with an n+-type region 28, a base metallization 30 in contact with a p-type base region 32 and an emitter metallization 34 in contact with an n+-type emitter region 36.

With the exception of epitaxial layer 4, integrated circuit 2, including MOSFET 8 and NPN 10, may be produced by any of the device fabrication techniques familiar to those skilled in the art and with any of the materials commonly used to fabricate such circuits. These techniques include, for example, diffusion, ion implantation, and other well known particle beam techniques. For further discussion of such techniques, see, for example, C. W. Pearce in Chapter 2 of *VLSI Technology*, edited by S.M. Sze and published by McGraw-Hill, 1983; W. R. Runyan and K. E. Bean in Chapter 7 of *Semiconductor Integrated Circuit Processing Technology*, published by Addison-Wesley, 1990; and J. W. Mayor and S. S. Lau in Chapter 8 of *Electronic Materials Science for Integrated Circuits in Si and GaAs*, published by MacMillian, 1990.

Except for the fact that an isotopically enriched silicon source is used, epitaxial layer 4 may also be formed by using any of the epitaxial techniques known to those skilled in the art, including, for example, chemical vapor deposition (CVD), high vacuum CVD, molecular beam epitaxy (MBE), implantation/recrystallization, and RF sputtering. Unless isotope enrichment is built into the epitaxial process, the percentage of $^{28}$Si in the silicon source material should, of course, be equal to whatever proportion of that isotope is desired in epitaxial layer 4. Thus, to form an epitaxial layer having 98% $^{28}$Si, one should use a source in which $^{28}$Si is present in that proportion. Such isotopically enriched silicon sources can be obtained from commercial suppliers such as, for example, Oak Ridge National Laboratories in Oak Ridge, Tenn. or Atomergic Chemetals in Farmingdale, N.Y.

The appropriate form of the source material, i.e., whether it is powdered, gaseous or liquid, depends upon the technique being used to grow the epitaxial layer. Thus, for example, if MBE is used, a powdered or solid bulk source of isotopically enriched silicon is appropriate. Whereas, if a CVD process is used, a gaseous source such as, for example, silane, disilane or silicon tetrachloride, would be more appropriate. If the isotopically enriched silicon is obtained in powdered or solid form, any of the other forms can readily be produced using known techniques.

Figure 2:
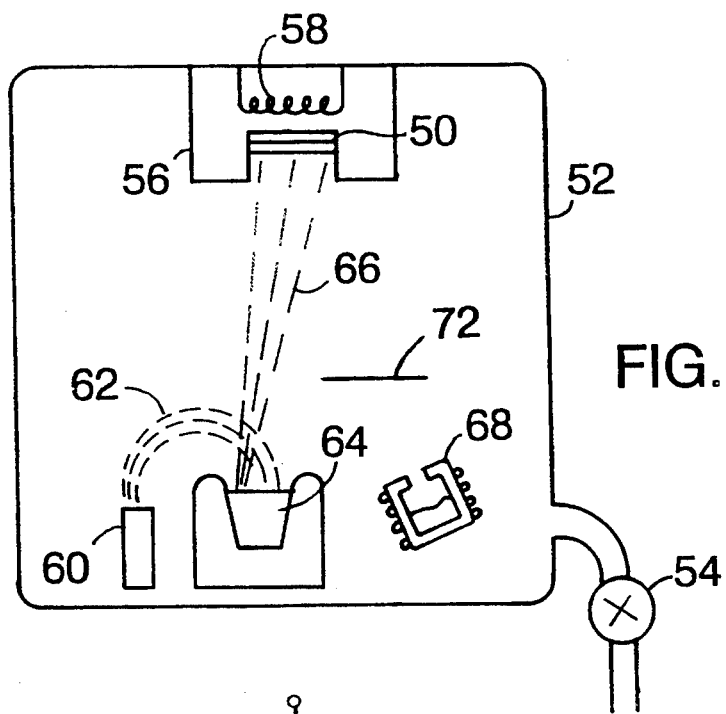
FIG. 2 is a schematic representation of a molecular beam epitaxy system for depositing a layer of isotopically enriched silicon.

FIG. 2 illustrates the basic components of an MBE system for growing an epitaxial layer of isotopically enriched silicon on a silicon substrate 50. The system includes a chamber 52 connected to a vacuum pump 54 which establishes the required vacuum in chamber 52. Inside chamber 52, a support 56 holds silicon substrate 50 that is heated by a heating element 58 to an appropriate temperature for MBE. An electron beam gun 60 generates an e-beam 62 that heats up and vaporizes a source 64 of isotopically enriched silicon 60, thereby generating a molecular beam 66 of silicon that deposits an epitaxial layer on substrate 50. A dopant effusion cell 68 may be used to introduce a dopant into the epitaxial layer as it is being grown. The supply of dopant from effusion cell 68 is controlled by a mechanical shutter 72.

The deposition process is continued until an epitaxial layer of desired thickness is achieved, e.g.2-3 microns for power devices or sub-micron thicknesses for high frequency devices. The operating parameters during deposition such as chamber pressure, the temperature of substrate 50, the temperature of effusion cell 68, the dopant source material used in effusion cell 68 and the duration of the growth cycle may be the same as those which are commonly used to deposit epitaxial layers of ordinary silicon and are well known to those skilled in the art.

During the deposition of the isotopically enriched silicon layer, precautions must be taken to assure that isotopes of silicon other than $^{28}$Si are not introduced into the epitaxial layer. For example, silicon from quartz tubes or containers used in the deposition system could be a source of such contamination if they are permitted to get too hot.

If the epitaxial layer is grown by ion implantation, it may not be necessary to use a source of isotopically enriched silicon. A mass separator could be used in the ion implantation equipment to select the $^{28}$Si from the ion stream and to exclude the other isotopes of silicon. Ion implantation techniques, however, typically generate amorphous layers which must recrystallized by using a high temperature anneal. Since the recrystallization may not eliminate all of the defects in the epitaxial layer, the benefits of using an isotopically enriched layer (i.e. the improved carrier mobilities and the thermal conductivities) could be masked by these residual defects.

Other embodiments are within the following claims. For example, it should be understood that the above example of an integrated circuit was merely illustrative. Although only a MOSFET and an NPN transistor were shown, the invention described herein has applicability to all electronic devices made using single-crystal silicon for which improved carrier mobility and/or improved thermal conductivity would provide a desired benefit. In this case, electronic devices is meant to include both passive devices (e.g., resistors) and active devices (e.g., transistors). The invention also has applicability to particular categories of semiconductor devices such as electro-optical devices including, for example, deflectors and modulators, and opto-electronic devices including, for example, lasers.

In addition, rather than using epitaxial layers made of isotopically enriched silicon, wafers made entirely of isotopically enriched silicon may be used. Such wafers may be cut from single-crystal silicon grown from a source of isotopically enriched silicon by any of the known crystal growing techniques, including, for example, the commonly used Czochralski technique.

In addition, isotopically enriched silicon can be used to replace materials currently used to provide heat sinking in some semiconductor devices such as, for example, semiconductor laser arrays.

Other embodiments use other isotopically enriched semiconductor materials, such as, Ge, Ge—Si, and GaAs. As with isotopically enriched silicon, such other isotopically enriched semiconductors will exhibit improved carrier mobilities and thermal conductivity. If such materials are used for device fabrication, the resulting devices will exhibit improvements in device performance corresponding to the higher carrier mobilities and thermal conductivities.

In its naturally occurring form, germanium is composed of about 7.8% $^{76}$Ge, 36.5% $^{74}$Ge, 7.8% $^{73}$Ge, 27.5% $^{72}$Ge and 20.5% $^{70}$Ge. Whereas, gallium in its naturally occurring form is composed of about 60.4% $^{69}$Ga and 39.6% $^{71}$Ga. Isotopically enriched forms of these materials include any composition in which the percentage of one isotope is increased in comparison to all other isotopes. Reducing the presence of other isotopes (i.e., increasing the isotopic purity of the material) will increase both the carrier mobilities and thermal conductivity of the resulting material. In general, it is desirable to use isotopically enriched material in which the other isotopes represent less than 6%, and more preferably, less than 2% of the composition. Thus, for example, isotopically enriched germanium for use in device fabrication might include more than 94% $^{74}$Ge and less than 6% of the other isotopes of Ge. Similarly, isotopically enriched gallium in GaAs that is used for device fabrication might include more than 94% $^{69}$Ga and less than 6% of $^{71}$Ga.

In the above examples, the isotope that was present in the naturally occurring semiconductor in the greatest proportions was selected as the dominant one in the enriched material. Note, however, that the objective is to reduce the presence all but one isotope. Therefore, any of the isotopes could be selected as the dominant isotope in the enriched material.

As with silicon, other isotopically enriched source material (i.e., powdered semiconductor material) can also be obtained from commercial suppliers who may use known techniques to produce the material. Once the isotopically enriched source material is obtained, devices may be fabricated from it by using any of the commonly known device fabrication technologies that are currently used to produce devices from the naturally occurring compositions of the semiconductor materials. In addition to the technologies already mentioned for silicon, examples of commonly used fabrication technologies for GaAs and germanium include molecular beam epitaxy (MBE) and organometallic chemical vapor deposition (OMCVD).

Figure 3:
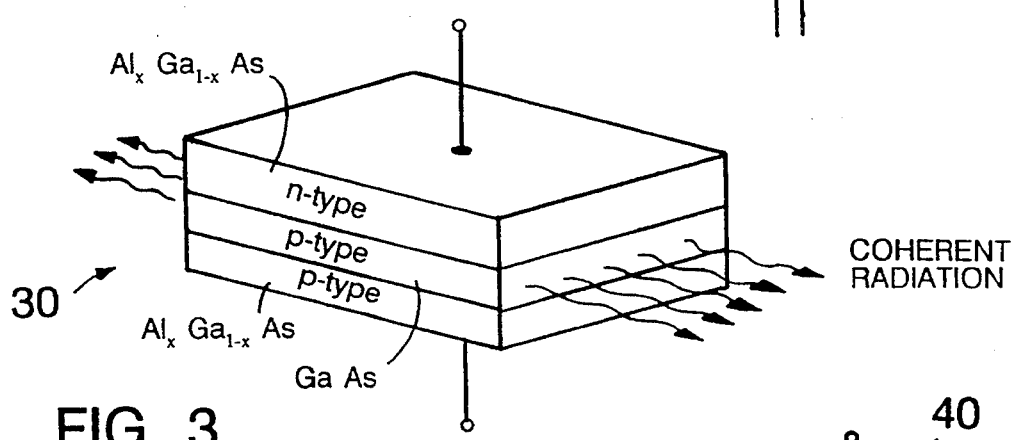
FIG. 3 is a double-heterostructure laser made from isotopically enriched GaAs.
Figure 4:
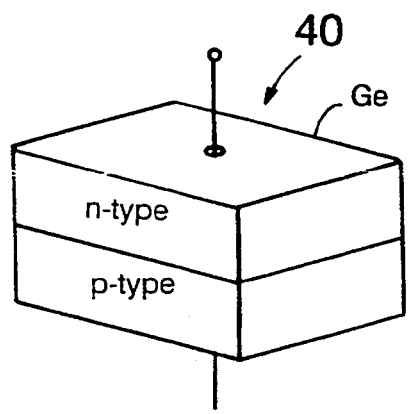
FIG. 4 is a diode made from isotopically enriched Ge.

The devices which may be constructed using the isotopically enriched semiconductor materials include all of the devices currently being fabricated using the naturally occurring semiconductor materials. For example, GaAs has commonly been used to build lasers (i.e., opto-electronic devices) such as the double-heterostructure laser 30 shown in FIG. 3, MESFET's (metal-semiconductor field effect transistors), and schottky devices and germanium has been used alone to construct germanium a variety of junction devices, such as diode 40 in FIG. 4, and in combination with silicon to construct multilayer Si—Ge structures. Using isotopically enriched semiconductors in these applications will improve those aspects of device performance related to the higher carrier mobilities and the higher thermal conductivities of the enriched materials.

Any of the other semiconductors may also be used in isotopically-enriched forms with similar benefits found in the devices fabricated from those materials. For example, one may use isotopically-enriched semiconductors from any of the Group IV—IV compounds, the Group III-V compounds, and the Group II-VI compounds. The Group IV—IV compounds include SiC. In that case, both elements Si and C have more than one stable isotope. Silicon has the previously identified isotopes and naturally occurring carbon includes has two isotopes, namely $^{12}$C and $^{13}$C. The Group III-V compounds include GaAs, InSb, InAs, InP, and GaInPAs. Naturally occurring gallium contains the previously identified isotopes. Naturally occurring indium contains two isotopes, namely, $^{115}$In (97.5%) and $^{113}$In (2.5%). And naturally occurring antimony contains two isotopes, namely, $^{121}$Sb (57.7%) and $^{123}$Sb (42.7%). The Group II-VI compounds include CdS, CdTe, HgTe, and HgCdTe. Naturally occurring cadmium contains at least five isotopes, namely, $^{114}$Cd (28.8%), $^{112}$Cd (24%), $^{110}$Cd (~12%), $^{111}$Cd (~12%), and $^{113}$Cd (~12%). Naturally occurring sulphur contains two isotopes, namely $^{32}$S (95%) and $^{34}$S (4.7%). Naturally occurring mercury contains four isotopes, namely, $^{202}$Hg (29.8%), $^{200}$Hg (23.1%), $^{199}$Hg (16.8%), and $^{198}$Hg (10%), And naturally occurring tellurium contains three isotopes, namely, $^{130}$Te (34.5%), $^{128}$Te (31.7%), and $^{126}$Te (18.7%).

Isotopically-enriched semiconductor material can be made from any of these compounds by isotopically enriching one or more of the elements found within the compound. Thus, for example, if the compound is CdS, isotopically enriched versions include compounds in which the cadmium is isotopically enriched, compounds in which the sulphur is isotopically enriched and compounds in which both elements are isotopically enriched.

What is claimed is:

1. A semiconductor structure comprising:
   a single-crystal region composed entirely of a single isotopically enriched material, wherein said isotopically enriched material is selected from a subset consisting of all semiconductor materials except elemental silicon and elemental carbon and wherein said isotopically enriched material exhibits enhanced bulk properties as compared to the bulk properties of naturally occurring forms of said material; and
   a semiconductor device formed by using said isotopically enriched semiconductor region so as to take advantage of the enhanced bulk properties of said isotopically enriched material.

2. The semiconductor structure of claim 1 further comprising a substrate and wherein said isotopically enriched semiconductor region is formed on one surface of said substrate.

3. The semiconductor structure of claim 2 wherein said isotopically enriched semiconductor region is a layer formed on one surface of said substrate.

4. The semiconductor structure of claim 1 wherein the enhanced bulk properties of said isotopically enriched material include higher carrier mobilities and/or thermal conductivity in comparison to naturally occurring forms of said material and wherein said semiconductor device exhibits improved device performance due to said higher carrier mobilities and/or thermal conductivity.

5. The semiconductor structure of claim 1 wherein said subset consists of group II—IV compounds, group III–V compounds, group II–VI compounds, and group IV elements.

6. The semiconductor structure of claim 5 wherein said subset consists of SiC.

7. The semiconductor structure of claim 5 wherein said subset consists of GaAs, InSb, InAs, InP, and GaInPAs.

8. The semiconductor structure of claim 5 wherein said subset consists of CdS, CdTe, HgTe, and HgCdTe.

9. The semiconductor structure of claim 1 wherein the semiconductor device is an electronic device.

10. The semiconductor structure of claim 1 wherein the semiconductor device is an electro-optical device.

11. The semiconductor structure of claim 1 wherein the semiconductor device is an opto-electronic device.

12. The semiconductor structure of claim 1 further comprising an integrated circuit fabricated in the isotopically enriched semiconductor region.

13. The semiconductor structure of claim I wherein said isotopically enriched semiconductor region primarily serves to provide heat dissipation for said device.

14. The semiconductor structure of claim 1 wherein said subset consists of group IV—IV compounds, group III–V compounds, and group II–VI compounds.

15. The semiconductor structure of claim 1 wherein said subset consists of group IV—IV compounds.

16. The semiconductor structure of claim 1 wherein said subset consists of group III-V compounds.

17. The semiconductor structure of claim 1 wherein said subset consists of group II-VI compounds.

* * * * *

UNITED STATES PATENT AND TRADEMARK OFFICE
CERTIFICATE OF CORRECTION

PATENT NO.  : 5,442,191

DATED       : August 15, 1995

INVENTOR(S) : Tso-Ping Ma

It is certified that error appears in the above-identified patent and that said Letters Patent is hereby corrected as shown below:

Col. 2, line 56, replace "Which" with --which--.

Col. 6, line 32, replace "And" with --and--.

Col. 8, claim 13, line 8, replace "I" with --1--.

Signed and Sealed this

Sixteenth Day of July, 1996

Attest:

BRUCE LEHMAN

Attesting Officer    Commissioner of Patents and Trademarks